(12) United States Patent
Kayode

(10) Patent No.: US 11,009,623 B2
(45) Date of Patent: May 18, 2021

(54) CALCULATING SHUT-IN BOTTOM-HOLE PRESSURE IN NUMERICAL RESERVOIR SIMULATIONS

(71) Applicant: Saudi Arabian Oil Company, Dhahran (SA)

(72) Inventor: Babatope Kayode, Dhahran (SA)

(73) Assignee: Saudi Arabian Oil Company, Dhahran (SA)

(*) Notice: Subject to any disclaimer, the term of this patent is extended or adjusted under 35 U.S.C. 154(b) by 106 days.

(21) Appl. No.: 16/513,337

(22) Filed: Jul. 16, 2019

(65) Prior Publication Data

US 2021/0018654 A1 Jan. 21, 2021

(51) Int. Cl.
| | | |
|---|---|---|
| *E21B 47/06* | (2012.01) | |
| *G01V 99/00* | (2009.01) | |
| *G06F 30/20* | (2020.01) | |
| *G01V 1/52* | (2006.01) | |
| *G06F 17/11* | (2006.01) | |

(52) U.S. Cl.
CPC .............. *G01V 99/005* (2013.01); *G01V 1/52* (2013.01); *G06F 17/11* (2013.01); *G06F 30/20* (2020.01)

(58) Field of Classification Search
CPC ...... E21B 47/06; E21B 41/0092; E21B 49/00; E21B 49/087; G01V 99/005
USPC .......................................................... 702/11
See application file for complete search history.

(56) References Cited

U.S. PATENT DOCUMENTS

| | | | | |
|---|---|---|---|---|
| 7,389,185 | B2* | 6/2008 | Craig | E21B 49/008 |
| | | | | 702/13 |
| 9,200,511 | B2* | 12/2015 | Hon | E21B 47/06 |
| 9,753,181 | B2* | 9/2017 | Gorell | G01V 99/005 |
| 10,233,749 | B2* | 3/2019 | Anisur Rahman | E21B 47/06 |
| 10,495,769 | B2* | 12/2019 | Kumar | G01V 1/30 |
| 10,534,877 | B2* | 1/2020 | Moyner | G06F 30/23 |
| 10,794,179 | B2* | 10/2020 | Agrawal | E21B 47/06 |
| 2010/0286971 | A1 | 11/2010 | Middya et al. | |
| 2015/0032377 | A1* | 1/2015 | McAuliffe | G01V 99/00 |
| | | | | 702/13 |
| 2020/0096671 | A1* | 3/2020 | Garcia-Teijeiro | G01V 1/345 |

OTHER PUBLICATIONS

Ding and Renard, "A New Representation of Wells in Numerical Reservoir Simulation," SPE-25248-PA, SPE Reservoir Engineering, May 1994, 5 pages.

(Continued)

*Primary Examiner* — Kenneth L Thompson
(74) *Attorney, Agent, or Firm* — Fish & Richardson P.C.

(57) ABSTRACT

Disclosed are methods, systems, and computer-readable medium to perform operations including: generating a grid representation of a reservoir model comprising a simulation well, the grid comprising a plurality of grid-blocks, wherein the simulation well is centered in grid-block (i) of the plurality of grid-blocks; simulating, using the grid representation, grid-block pressures for the plurality of grid-blocks over a plurality of time steps; calculating an equivalent radius (ro*) for a grid-block (i+1), wherein the grid-block (i+1) is adjacent to the grid-block (i); and calculating, based on the equivalent radius and a grid-block (i+1) pressure, a shut-in bottom-hole pressure (SBHP) for the simulation well.

17 Claims, 9 Drawing Sheets

(56) References Cited

OTHER PUBLICATIONS

Earlougher Jr. et al., "Comparing Single-Point Pressure Build-up Data with Reservoir Simulator Results," SPE-3898-PA, JPT forum, Jun. 1972, 2 pages.
Peaceman, "Interpretation of Well-Block Pressures in Numerical Reservoir Simulation," SPE-6893-PA, Society of Petroleum Engineers of IME, Jun. 1978, 17 pages.
Van Poollen et al., "Treatment of Individual wells and Grids in Reservoir Modelling," SPE-2022-PA, Transactions vol. 243, Dec. 1968, 6 pages.
PCT International Search Report and Written Opinion in International Appln. No. PCT/US2020/041913, dated Nov. 5, 2020, 15 pages.

* cited by examiner

| Qo bopd | Bo rb/stb | ViscO cp | K md | h ft | Poro | Ct 1/psi | Pi psia | tp hrs | GRID SIZE ft |
|---|---|---|---|---|---|---|---|---|---|
| 100 | 1.66 | 0.26 | 5 | 5 | 0.3 | 0.000437 | 5000 | 120 | 50*50*5 |

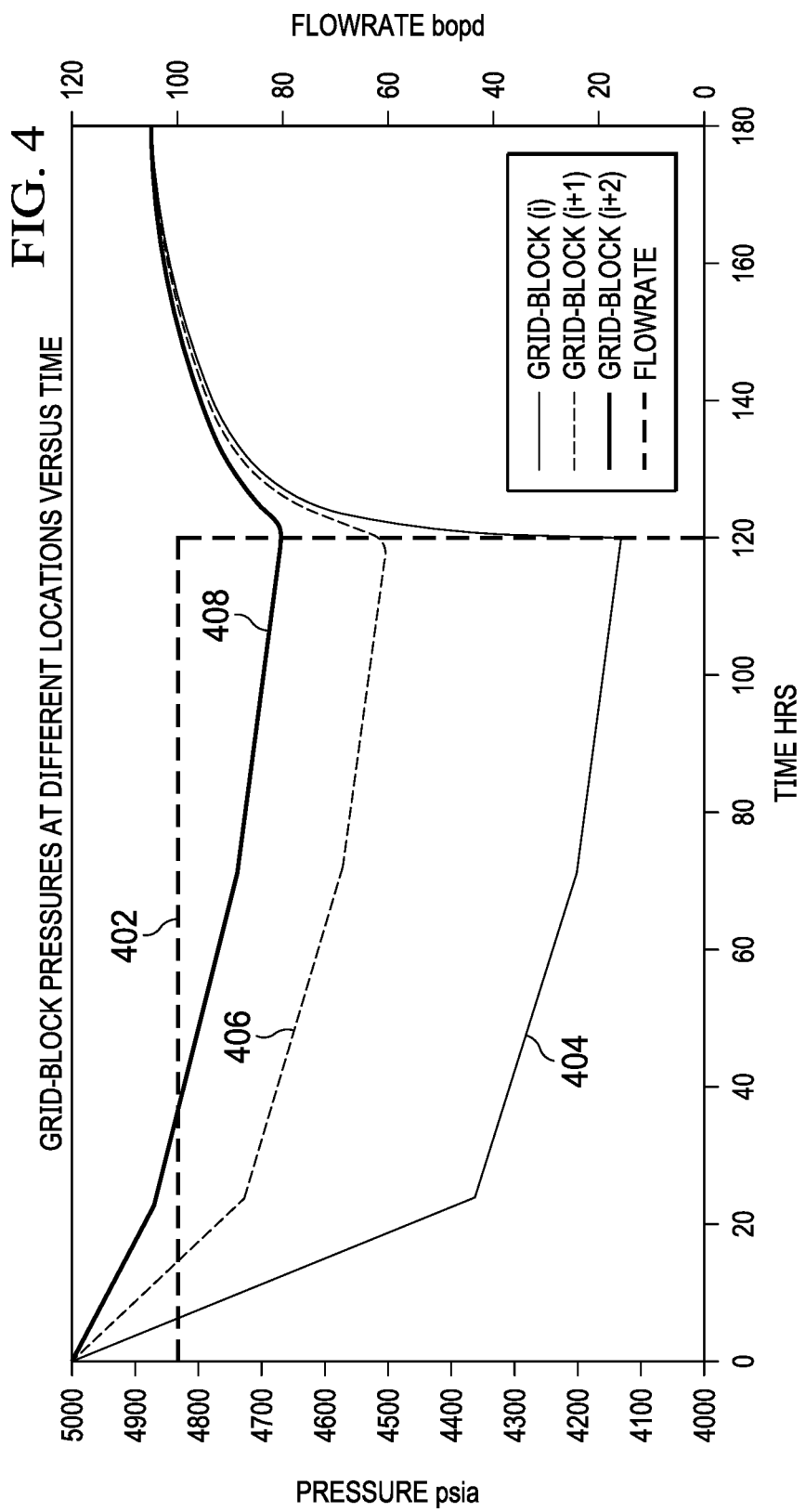

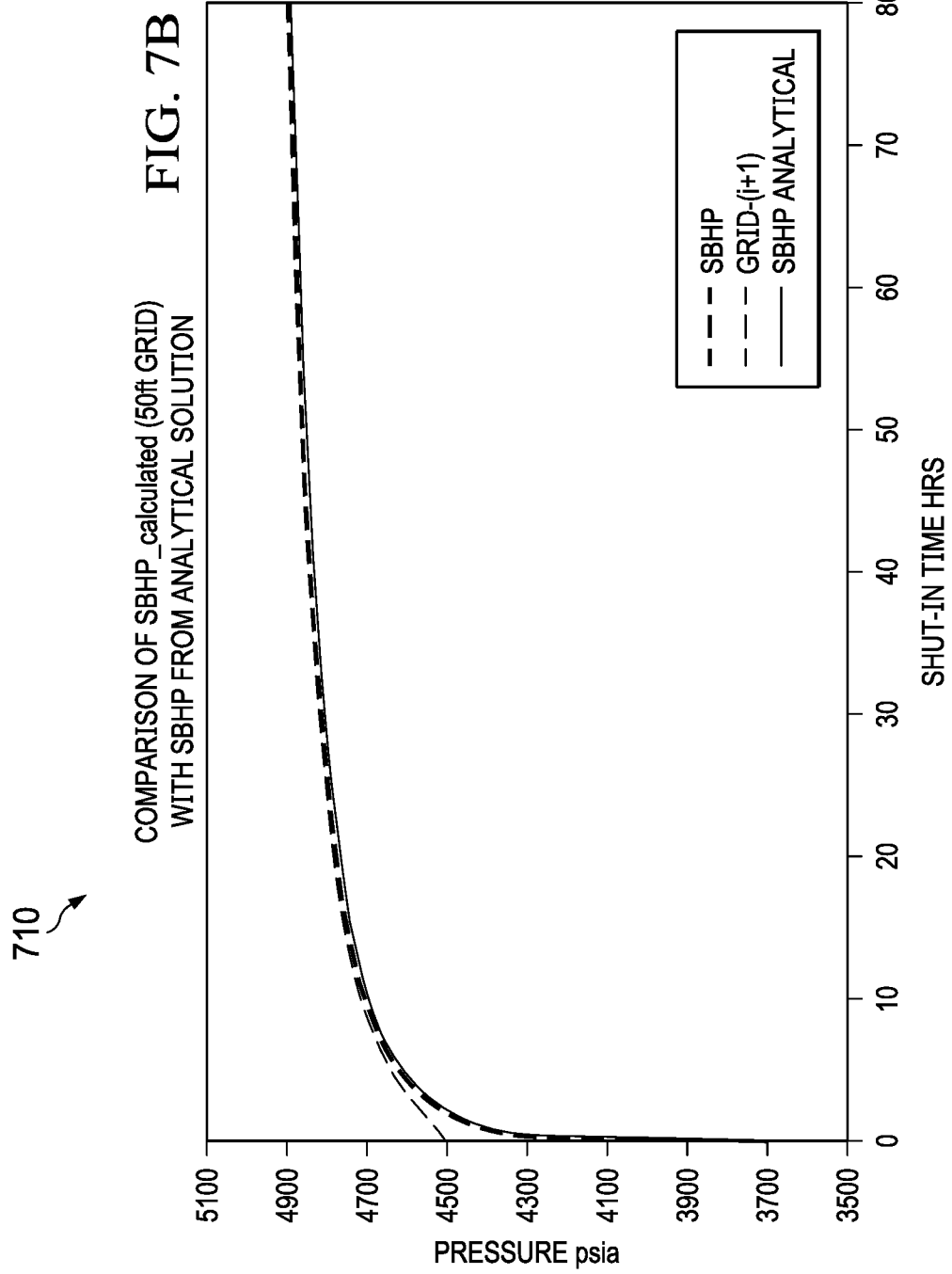

CALCULATING SHUT-IN BOTTOM-HOLE PRESSURE IN NUMERICAL RESERVOIR SIMULATIONS

TECHNICAL FIELD

This disclosure relates to numerical simulations of hydrocarbon reservoir.

BACKGROUND

Numerical simulation of a reservoir involves constructing a dynamic model of the reservoir that simulates the behavior of the reservoir. Generally, the reservoir model is a mathematical model defined using a set of equations that are subject to operating constraints and that describe the properties and processes of the reservoir. For example, the mathematical model may describe fluid flow throughout the reservoir, including areas of the reservoir that include production or injection wells. Such mathematical model is used by a numerical simulator to simulate performance of the reservoir. For example, the numerical simulator may simulate performance of the well under different operating conditions (for example, changing injection pressures, adding wells to the reservoir, producing from wells).

The dynamic reservoir model can be improved by history matching. In history matching, the reservoir model is adjusted based on past behavior of the reservoir. In particular, the model is adjusted such that the output of the model reproduces, or is consistent with, the past behavior of the reservoir. For example, once measured data from the reservoir (also referred to as production data) is obtained, the reservoir model can be refined (for example, by adjusting the set of equations that define the model) until the output of the model is consistent with the production data.

SUMMARY

One of the properties simulated by commercial simulators is pressure distribution in a reservoir that includes a well. To perform the simulation, the simulators discretize the reservoir into a plurality of grid-blocks that are each assigned properties of the reservoir. Then, the simulators explicitly calculate, as a function of flow rates of the well, an average pressure value for each grid-block, perhaps at a plurality of time-steps. The simulators use the respective grid-block pressure of each grid-block to calculate reservoir properties. For example, the simulators compute, based on the grid-block pressures, a flowing bottom-hole pressure and an average reservoir pressure. However, the commercial simulators do not calculate shut-in bottom-hole pressure.

The present disclosure describes methods for calculating shut-in bottom-hole pressure in numerical reservoir simulations. Aspects of the subject matter described in this specification may be embodied in methods that include the actions of: generating a grid representation of a reservoir model comprising a simulation well, the grid comprising a plurality of grid-blocks, wherein the simulation well is centered in a grid-block (i) of the plurality of grid-blocks; simulating, using the grid representation, grid-block pressures for the plurality of grid-blocks over a plurality of time steps; calculating an equivalent radius (ro*) for a grid-block (i+1), wherein the grid-block (i+1) is adjacent the grid-block (i); and calculating, based on the equivalent radius and a grid-block (i+1) pressure, a shut-in bottom-hole pressure (SBHP) for the simulation well.

The previously described implementation is implementable using a computer-implemented method; a non-transitory, computer-readable medium storing computer-readable instructions to perform the computer-implemented method; and a computer system comprising a computer memory interoperably coupled with a hardware processor configured to perform the computer-implemented method or the instructions stored on the non-transitory, computer-readable medium. These and other embodiments may each optionally include one or more of the following features.

In a first aspect, the equivalent radius for the grid-block (i+1) is a distance from the simulation well at which actual pressure is equal to the grid-block (i+1) average pressure, and the equivalent radius is calculated according to the equation: $r_o^* = 0.5\Delta x + r_o$, where $\Delta x$ is a grid-block width and $r_o$ is a conventional equivalent radius for the grid-block (i+1).

In a second aspect, the conventional equivalent radius is a radius at which the grid-block (i+1) pressure is equal to the pressure from an analytical solution for steady-state single-phase flow in the grid-block (i+1), and the conventional equivalent radius is calculated according to the equation: $r_o = 0.32\Delta x$.

In a third aspect, calculating, based on the equivalent radius and the grid-block (i+1) pressure, the SBHP for the simulation well includes: calculating the SBHP using the equation:

$$P_{(r_w,\Delta t)} = P_{(r_o^*,\Delta t)} - \left[\theta\left(-Ei\left(\frac{-\alpha r_o^{*2}}{\Delta t}\right)\right) - \theta\left(-Ei\left(\frac{-\alpha r_o^{*2}}{(t_p + \Delta t)}\right)\right) - \theta\left(-Ei\left(\frac{-\alpha r_w^2}{\Delta t}\right)\right) + \theta\left(-Ei\left(\frac{-\alpha r_w^2}{(t_p + \Delta t)}\right)\right)\right],$$

where $r_w$ is a wellbore radius, $t_p$ is a shut-in time, $$\theta = 70.6\frac{q\beta\mu}{kh},\ \alpha = \left(\frac{-948\phi\mu c_t}{\kappa}\right),$$

q is an oil flow rate, $\beta$ is a formation volume factor, $\mu$ is a viscosity of oil at reservoir conditions, k is reservoir permeability, h is reservoir thickness, $\phi$ is reservoir porosity fraction, and $c_t$ is total compressibility.

In a fourth aspect, calculating the shut-in bottom-hole pressure (SBHP) for the simulation well is further based on $-Ei(-x)$ versus $(-x)$ values.

In a fifth aspect, the SBHP is validated by an analytically derived SBHP, the analytically derived SBHP calculated using the equation:

$$P_i - P_{(r_w,\Delta t)} = 70.6\frac{q\beta\mu}{kh}\text{Ln}\left(\frac{t_p + \Delta t}{\Delta t}\right).$$

In a sixth aspect, comparing the SBHP to actual shut-in gauge pressures from a reservoir corresponding to the reservoir model; and based on the comparison, calibrating the reservoir model.

Particular implementations of the subject matter described in this specification can be implemented to realize one or more of the following advantages. First, the disclosed methods calculate shut-in bottom-hole pressure in numerical simulations, which is not calculated by commercial numerical simulators. Second, the disclosed methods ensure that the output of the simulation results are directly comparable to measured pressure data from the field, which is not feasible in commercial numerical simulators. Other advantages will be apparent to those of ordinary skill in the art.

The details of one or more implementations of the subject matter of this disclosure are set forth in the description, the claims, and the accompanying drawings. Other features, aspects, and advantages of the subject matter will become apparent from the description, the claims, and the accompanying drawings.

BRIEF DESCRIPTION OF THE DRAWINGS

FIG. 4 illustrates average grid-block pressure versus time graphs for grid-block (i), grid-block (i+1), and grid-block (i+2), according to some implementations of the present disclosure.

FIG. 7B illustrates a comparison of shut-in bottom-hole pressure calculated using a disclosed method with an analytically calculated SBHP, and a simulation grid (i+1) pressure, according to some implementations of the present disclosure.

Like reference numbers and designations in the various drawings indicate like elements.

DETAILED DESCRIPTION

The following detailed description describes systems and methods for calculating shut-in bottom-hole pressure (SBHP) in numerical simulations. The description is presented to enable a person skilled in the art to make and use the disclosed subject matter in the context of one or more particular implementations. Various modifications, alterations, and permutations of the disclosed implementations can be made and will be readily apparent to those skilled in the art. Furthermore, the general principles defined may be applied to other implementations and applications without departing from the scope of the disclosure. Thus, the present disclosure is not intended to be limited to the described or illustrated implementations. Rather, the present disclosure is to be accorded the widest scope consistent with the principles and features disclosed.

Figures 1, 2:
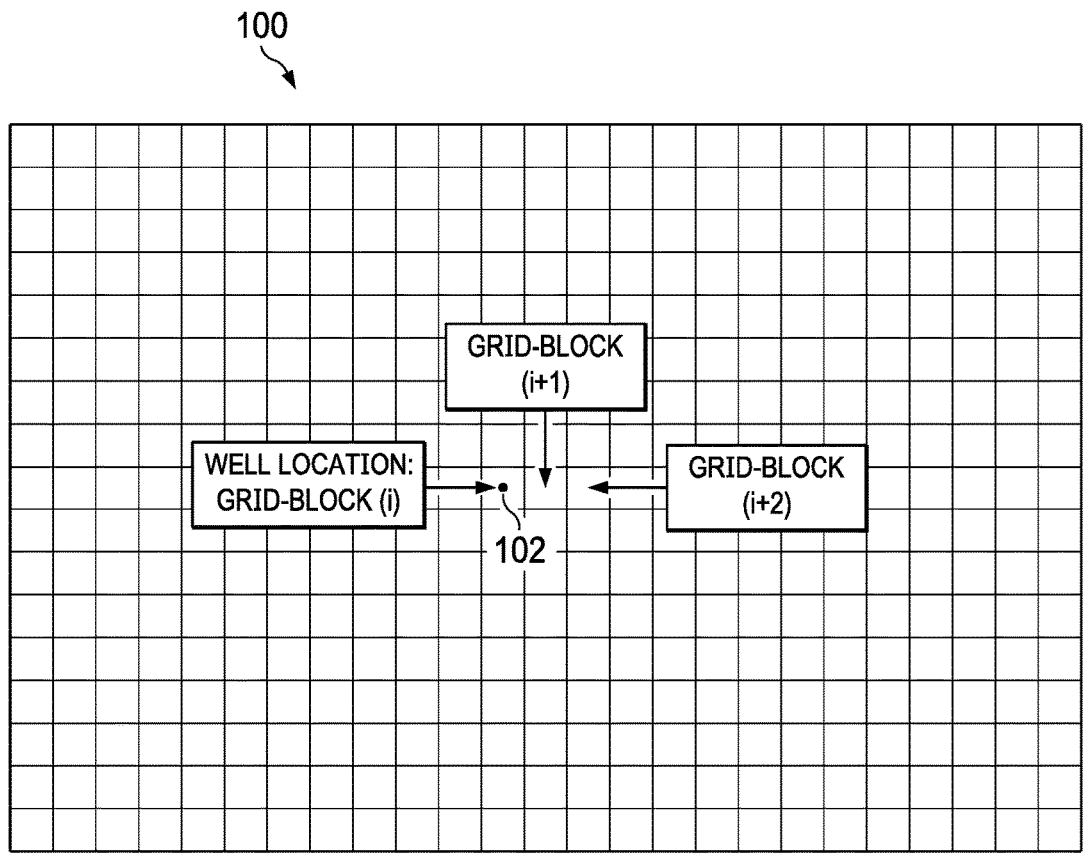
FIG. 1 illustrates a representation of a reservoir model, according to some implementations of the present disclosure.
FIG. 2 illustrates a table of reservoir model properties and flow constraints, according to some implementations of the present disclosure.

FIG. 1 illustrates a representation 100 of a reservoir model, according to some implementations. The reservoir model describes properties and geometry of formations that form an actual reservoir, the flow and volumetric properties of reservoir fluids, well locations, and well flow capacities. In this implementation, the representation 100 is a two-dimensional grid that is generated by discretizing the reservoir into a plurality of grid-blocks. Each grid-block has a respective identifier (for example, the respective coordinates of the grid-block). Additionally, each grid-block is assigned values of reservoir properties so that the grid-block represents a respective portion of the reservoir. Once reservoir properties are assigned to the grid-blocks, numerical simulators can use the representation 100 to perform numerical simulations that simulate behavior of the reservoir, perhaps over a plurality of time-steps.

To simulate performance of a well in the reservoir, a simulation well may be added to the representation 100. For example, as shown in FIG. 1, a simulation well 102 is added to the representation 100 within a grid-block identified as grid-block (i). In this example, the simulation well 102 is centered within the grid-block (i) and has a wellbore radius of $r_w$. The grid-block adjacent to grid-block (i) is identified as grid-block (i+1) and the grid-block adjacent to grid-block (i+1) is identified as grid-block (i+2). In this example, grid-block (i+1) is adjacent to grid-block (i) on the right, but the grid-block (i+1) can be adjacent to the grid-block (i) on any side. Similarly, grid-block (i+2) can be adjacent to the grid-block (i+1) on any side.

FIG. 2 illustrates a table 200 of model properties and flow constraints, according to some implementations. The values of the model properties and flow constraints included in table 200 define the reservoir model. As shown in table 200, the reservoir model properties include oil flow rate (Qo) in barrels of oil per day (bopd), formation volume factor (β or Bo) in reservoir barrels/stock tank barrel (rb/stb), viscosity of oil at reservoir conditions (p or ViscO) in centipoise (cP), reservoir permeability (k) in millidarcy (mD), reservoir thickness (h) in feet (ft), reservoir porosity fraction (ϕ or Poro), total (fluid+rock) compressibility (ct) in inverse pounds of force per square inch ($psi^-$), initial reservoir pressure ($P_i$) in pounds per square inch absolute (psia), well flow time ($t_p$) in hours, and simulation grid size in feet (ft). The reservoir model properties can also include reservoir rock properties, fluid physical parameters, relative permeability and capillary pressure data, and well positions.

Numerical simulators can use the representation 100 of the reservoir model to simulate performance of the reservoir. In an implementation, the numerical simulators perform simulations of pressure distributions, at different times, in the reservoir. To perform this simulation, the numerical simulators explicitly calculate, as a function of flow rates of the simulation well 102, an average pressure value for each grid-block at each time-step of a plurality of time-steps (as defined by simulation parameters). The calculated average pressure values are also referred to as grid-block pressures. For such calculations, the numerical simulators assume that the reservoir is an infinite-acting reservoir (that is, a reservoir without boundaries affecting fluid flow). Additionally, the numerical simulators assume a radial flow around the simulation well 102. The calculated grid-block pressures can then be used to calculate values for properties or variables that are indicative of the wellbore performance. In an example, the grid-block pressures are used to calculate flowing bottom-hole pressures (for example, using Peaceman's equation). In another example, weighted averages of one or more grid-block pressures of one or more grid-blocks surrounding grid-block (i) are used to calculate an average reservoir pressure.

Figure 3:
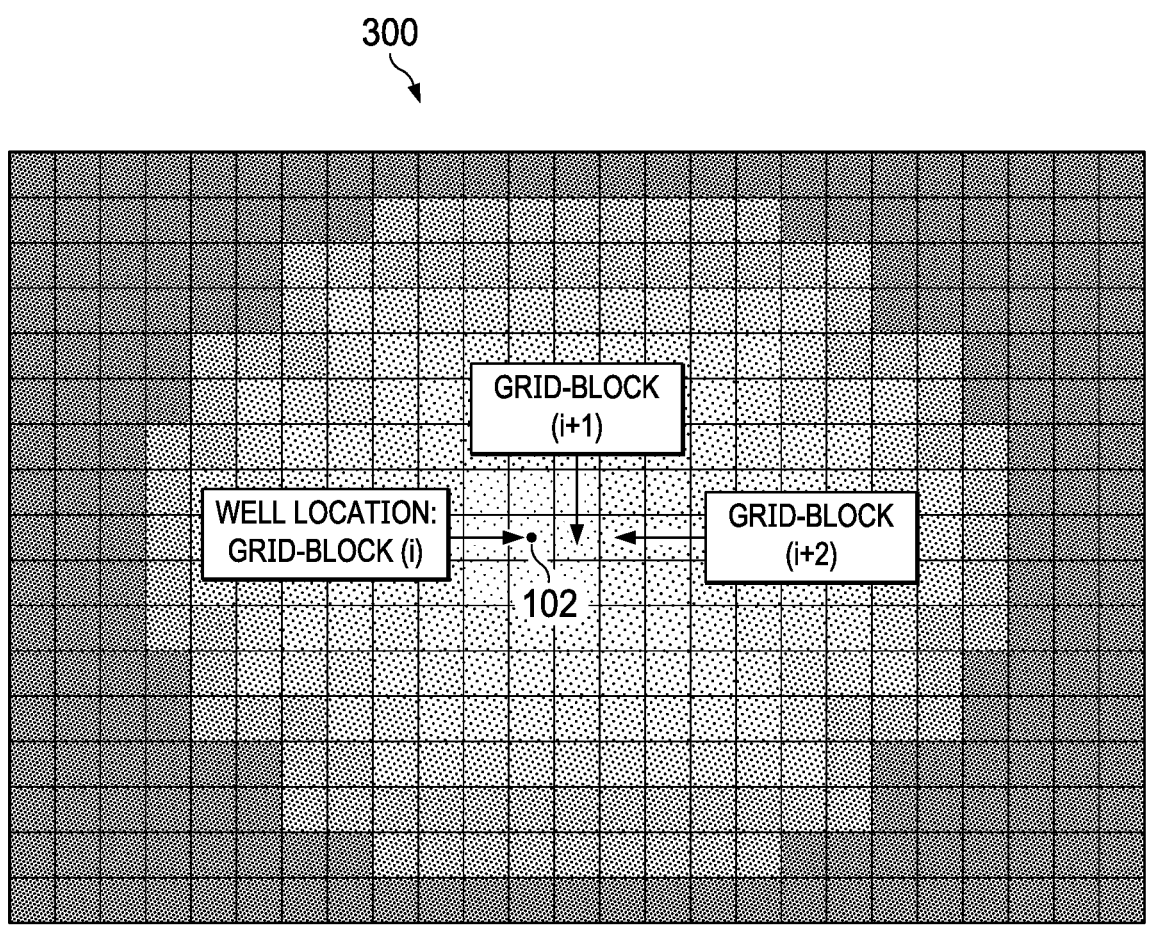
FIG. 3 illustrates a grid-block pressure distribution map, according to some implementations of the present disclosure.

FIG. 3 illustrates a grid-block pressure distribution map 300 for the simulation well 102 at time $t_1$, according to some implementations. The pressure distribution map 300 is an intensity map in which a degree of contrast intensity is indicative of an absolute magnitude of the grid-block pressure. As shown by the pressure distribution map 300, the grid-block pressure increases with increasing distance from the grid-block (i).

In an implementation, one of the simulations performed by numerical simulators may involve simulating the simulation well 102 at a constant flow-rate followed by a shut-in (that is, buildup). This simulation involves the simulation well 102 operating at a constant flow-rate for $t_p$ hours. The well is then shut in after $t_p$ hours.

FIG. 4 illustrates average grid-block pressure versus time for grid-block (i), grid-block (i+1), and grid-block (i+2), according to some implementations. As shown by graph 402, the simulation well 102 is simulated at a constant flow-rate from t=0 hours to $t_p$=120 hours. The simulation well 102 is then shut in at 120 hours. Graphs 404, 406, and 408 illustrate the average grid-block pressure over time of grid-blocks (i), (i+1), and (i+2), respectively.

This well shut-in simulation facilitates calibrating the reservoir model to measured shut-in gauge pressures in the field. In commercial simulators, the closest simulation output to measured shut-in gauge pressures is the pressure profile at grid-block (i), which is an average pressure value for the entire grid-block (i). In high permeability reservoirs where reservoir pressure quickly builds up to a stabilized value, it can be adequate to interpret the shut-in gauge pressures as an average reservoir pressure. Thus, in such reservoirs, the measured shut-in gauge pressures can be compared with the simulated average reservoir pressure in order to calibrate the reservoir model. However, for large reservoirs with very low permeability (for example, k<1 mD), gauge pressures show pressure still building up after a long period (for example, tens or hundreds of hours) of shut-in. In such tight reservoirs where gauge pressure is still building up after long shut-in periods, the final pressure gauge reading cannot be interpreted as an average reservoir pressure. Therefore, in such scenarios, the final gauge reading cannot be compared with the simulated average reservoir pressure.

Figure 5A:
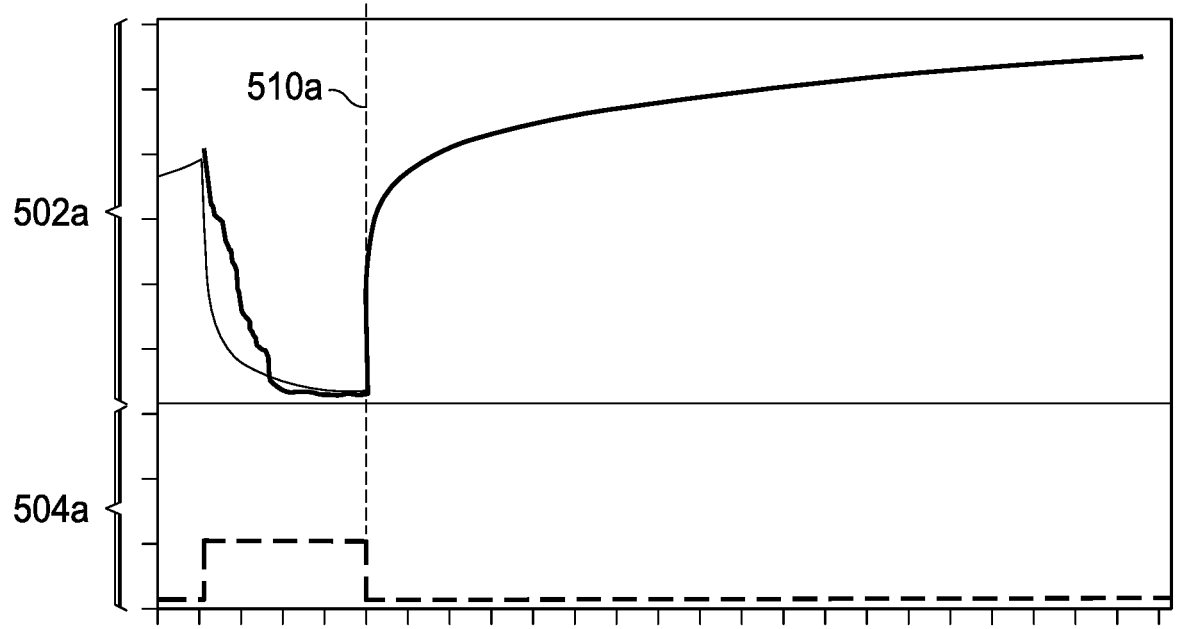
FIGS. 5A and 5B illustrate shut-in pressure surveys where gauge pressure is still increasing after a long period of shut-in, according to some implementations of the present disclosure.
Figure 5B:
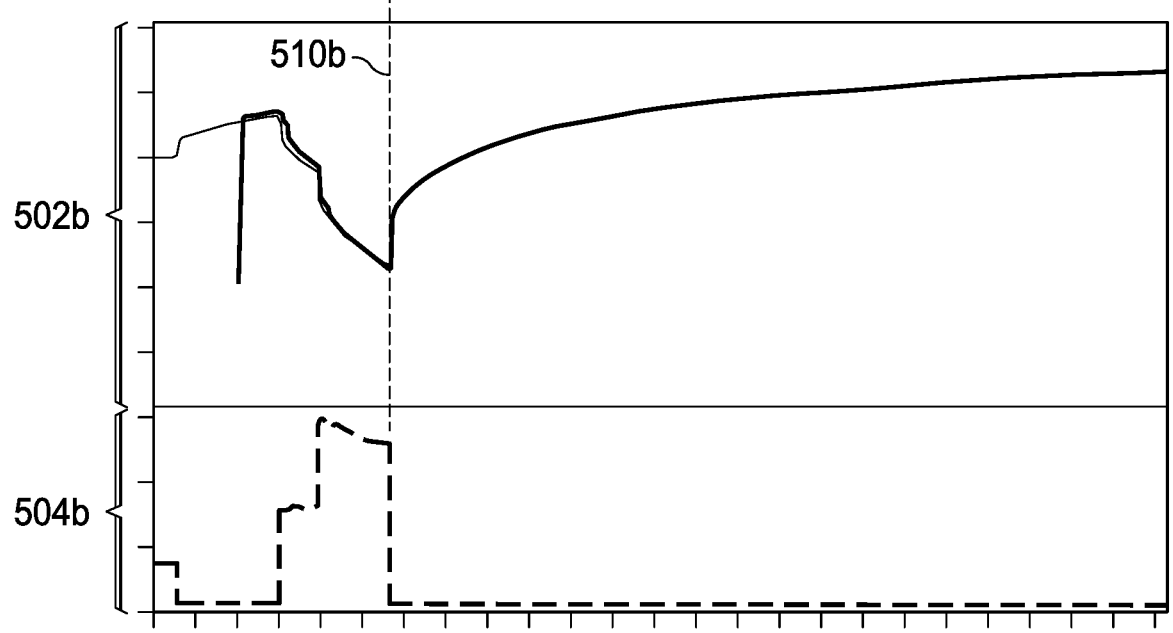

FIGS. 5A and 5B illustrate shut-in pressure surveys 500, 506 where gauge pressure is still increasing after a long period of shut-in, according to some implementations. Graphs 502a, 502b are the simulated average pressure and graphs 504a, 504b are of the well flow-rate. As shown by graphs 504a, 504b, shut-in occurs at $t_p$ (marked in FIGS. 5A and 5B by lines 510a, 510b). As shown by graphs 502a, 502b, there is continuous pressure building up after shut-in.

In this example, the surveys show a build-up of pressure is still taking place after 400 hours of shut-in.

Disclosed is a method for simulating shut-in bottom-hole pressure (SBHP) at the wellbore radius $r_w$. In an embodiment, the disclosed method calculates the SBHP using an average pressure of grid-block (i+1). The disclosed method accurately calculates the SBHP even in tight reservoirs. Furthermore, the simulated SBHP can be directly compared to the measured shut-in gauge pressures in order to calibrate the reservoir model. For the purposes of this disclosure, the disclosed method is described in the context of the single simulation well 102. However, the method can be expanded to simulations of more than one well. Also disclosed is an explanation of why the grid-block (i) pressure is not suitable as basis for calculating the shut-in bottom-hole pressure.

In theory, the pressure drawdown of the simulation well 102, which is producing in a homogeneous infinite-acting reservoir, is calculated as the difference between the reservoir pressure, $P_i$, and the pressure of the simulation well 102, $P_{(r,t)}$. The governing equation for the pressure drawdown of the simulation well 102 is:

$$P_i - P_{(r,t)} = -70.6 \frac{q\beta\mu}{\kappa h} Ei\left(\frac{-948\phi\mu c_t r^2}{\kappa t}\right). \quad (1)$$

In equation (1), q is a flow rate in bopd, p is a formation volume factor in rb/stb, $\mu$ is a viscosity of oil at reservoir conditions in cP, k is a reservoir permeability in mD, h is a reservoir thickness in ft, $\phi$ is a reservoir porosity fraction, r is a distance from wellbore in ft, ct is the total (that is, rock and fluid) compressibility in $psi^{-1}$, and t is time in hours.

When the simulation well 102 is shut-in after flowing for a time $t_p$, the governing equation is derived, using the superposition principle, as:

$$P_i - P_{(r,\Delta t)} = \quad (2)$$
$$-70.6 \frac{q\beta\mu}{\kappa h} Ei\left(\frac{-948\phi\mu c_t r^2}{\kappa(t_p+\Delta t)}\right) - 70.6 \frac{(-q)\beta\mu}{\kappa h} Ei\left(\frac{-948\phi\mu c_t r^2}{\kappa(\Delta t)}\right).$$

Equation (2) is used to calculate the shut-in pressure using the grid-block (i+1) pressure. To do so, an equivalent radius, $r_o^*$, is first calculated for the grid-block (i+1). The equivalent radius, $r_o^*$, is the distance from the simulation well 102 at which the actual wellbore pressure is equal to the simulated grid-block (i+1) pressure. Because the simulation well 102 is centered within grid-block (i) that has a width of "$\Delta x$" feet, $r_o^*$ is defined as:

$$r_o^* = 0.5\Delta x + r_o \quad (3)$$

In equation (3), $0.5\Delta x$ is the distance from the midpoint of grid-block (i) to the exit face of grid-block (i) and $r_o$ is a conventional definition of pressure equivalent radius for grid-block (i+1). That is, $r_o$ is a radius at which the grid-block (i+1) pressure is equal to the pressure from an analytical solution for steady-state single-phase flow.

In an embodiment, $r_o$ is calculated by considering that, regardless of flow assumptions (for example, transient flow, steady state, semi-steady state), the distribution of pressure from an inlet to an outlet of a grid-block is a logarithmic function of distance (as shown in equation (2)). The centroid of logarithmic distribution is at 0.32 (that is, $\log_{10}(0.32)=0.505$). Therefore, the real average pressure within a grid-block corresponds to the pressure at the centroid of the logarithmic scale. Thus, the reported average pressure in each grid-block can be defined as the actual pressure at distance of $0.32\Delta x$ from the grid-block inlet. Accordingly, $r_o$ is equal to $0.32\Delta x$. For the grid-block (i+1), $r_o^* = 0.5\Delta x + 0.32\Delta x = 0.82\Delta x$.

Figure 6:
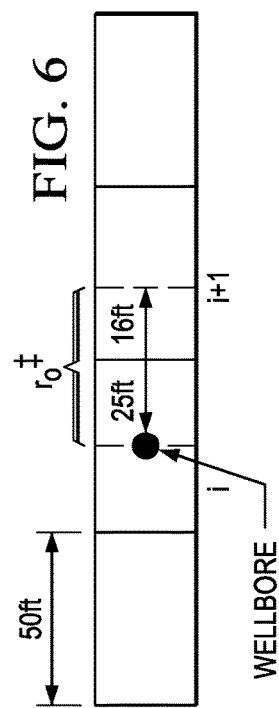
FIG. 6 illustrates an equivalent radius for the grid-block (i+1), according to some implementations of the present disclosure.

FIG. 6 illustrates the equivalent radius for the grid-block (i+1), according to some implementations. In this example, the grid-block width is 50 feet. Accordingly, $0.5\Delta x$, the distance from the midpoint of grid-block (i) to the exit face of grid-block (i), is 25 feet and $r_o$ is 16 ft.

Returning to equation (2), the equation can be simplified as:

$$P_i - P_{(r,\Delta t)} = \theta\left(-Ei\left(\frac{-\alpha r^2}{(t_p + \Delta t)}\right)\right) - \theta\left(-Ei\left(\frac{-\alpha r^2}{\Delta t}\right)\right), \text{ where} \quad (4)$$

$$\theta = 70.6 \frac{q\beta\mu}{\kappa h},$$

$$\alpha = \left(\frac{-948\phi\mu c_t}{\kappa}\right).$$

Evaluating equation (4) at each of $r_o^*$ and $r_w$ results in:

$$P_{(r_o^*,\Delta t)} = P_i - \theta\left(-Ei\left(\frac{-\alpha r_o^{*2}}{(t_p + \Delta t)}\right)\right) + \theta\left(-Ei\left(\frac{-\alpha r_o^{*2}}{\Delta t}\right)\right), \quad (5)$$

$$P_{(r_w,\Delta t)} = P_i - \theta\left(-Ei\left(\frac{-\alpha r_w^2}{(t_p + \Delta t)}\right)\right) + \theta\left(-Ei\left(\frac{-\alpha r_w^2}{\Delta t}\right)\right). \quad (6)$$

To eliminate $P_i$ from the equations, equation (7) is subtracted from equation (6), which results in:

$$P_{(r_o^*,\Delta t)} - P_{(r_w,\Delta t)} = \theta\left(-Ei\left(\frac{-\alpha r_o^{*2}}{\Delta t}\right)\right) - \quad (7)$$
$$\theta\left(-Ei\left(\frac{-\alpha r_o^{*2}}{(t_p + \Delta t)}\right)\right) - \theta\left(-Ei\left(\frac{-\alpha r_w^2}{\Delta t}\right)\right) + \theta\left(-Ei\left(\frac{-\alpha r_w^2}{(t_p + \Delta t)}\right)\right).$$

The SBHP (that is, $P_{(r_w,\Delta t)}$) is simulated by re-arranging equation (7) as:

$$P_{(r_w,\Delta t)} = P_{(r_o^*,\Delta t)} - \left[\theta\left(-Ei\left(\frac{-\alpha r_o^{*2}}{\Delta t}\right)\right) - \quad (8)\right.$$
$$\left.\theta\left(-Ei\left(\frac{-\alpha r_o^{*2}}{(t_p + \Delta t)}\right)\right) - \theta\left(-Ei\left(\frac{-\alpha r_w^2}{\Delta t}\right)\right) + \theta\left(-Ei\left(\frac{-\alpha r_w^2}{(t_p + \Delta t)}\right)\right)\right].$$

In an implementation, equation (8) is rigorously solved using the value of $r_o^*$ for grid-block (i+1), known $-Ei(-x)$ versus $(-x)$ values, and the grid-block (i+1) average block pressures at each time-step. In an example, a Visual Basic (VB) code can be written to solve equation (8) for each time-step. For instance, continuing with the example of the simulation well 102, equation (8) can be evaluated at $r_o^* = 41$ feet and $r_w = 1$ foot. Once the SBHP is calculated, it can be directly compared to the measured shut-in gauge pressures in the field to calibrate the reservoir model.

In an embodiment, the SBHP calculated by the disclosed methods can be validated by comparing it to an analytically calculated SBHP. The analytical description of bottom-hole shut-in pressure is given by:

$$P_i - P_{(r_w,\Delta t)} = 70.6 \frac{q\beta\mu}{\kappa h} \text{Ln}\left(\frac{t_p + \Delta t}{\Delta t}\right) \quad (9)$$

Equation (9) is derived from equation (2) by evaluating the right hand side of equation (2) at $r = r_w$ and assuming that the $Ei(x)$ function can be approximated by the natural logarithm, as shown by equation (10):

$$-Ei(x) \approx \ln(1.78 \ast x). \quad (10)$$

In an implementation, equation (9) can be evaluated at each time-step to calculate the SBHP analytically.

Figure 7A:
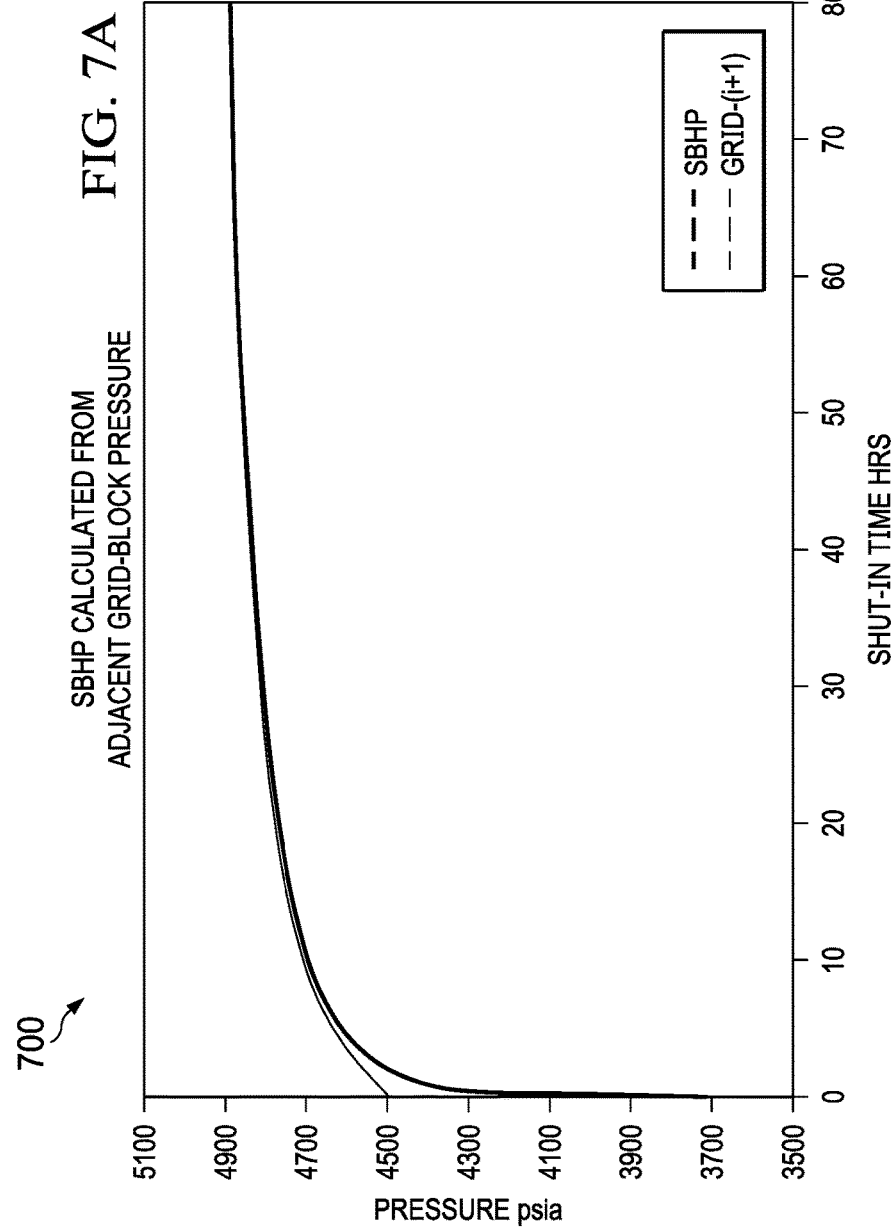
FIG. 7A illustrates a comparison of shut-in bottom-hole pressure calculated using a disclosed method and the simulation grid-block (i+1) pressure from which it was calculated, according to some implementations of the present disclosure.

FIG. 7A illustrates a graph 700 of a calculated SBHP and the grid-block (i+1) pressure from which the SBHP was calculated, according to some implementations. In particular, the graph 700 compares the calculated SBHP and the grid-block (i+1) pressure after shut-in. As shown by the graph 700, the calculated SBHP is different from the grid-block (i+1) pressure after shut-in.

FIG. 7B illustrates a graph 710 of SBHP calculated from grid (i+1) pressures and an analytically calculated SBHP (calculated using equation (9)), according to some implementations. As shown by the graph 710, the calculated SBHP is very similar to the analytically calculated SBHP. This indicates that the disclosed method of calculating SBHP based on the grid-block (i+1) pressure is consistent with analytical results, and therefore, accurate.

Figure 8:
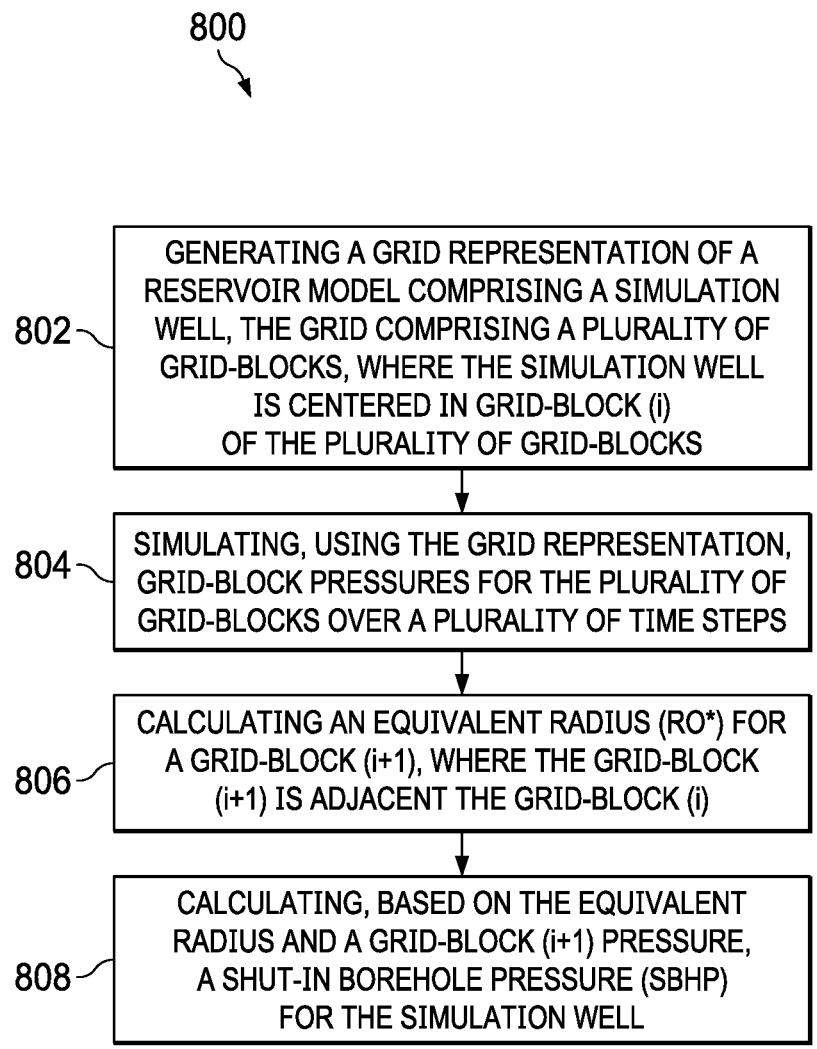
FIG. 8 illustrates a flowchart of an example method, according to some implementations of the present disclosure.

FIG. 8 is a simplified block diagram of an example method 800 for simulating shut-in borehole pressure, according to some implementations. For clarity of presentation, the description that follows generally describes method 800 in the context of the other figures in this description. For example, method 800 can be performed by a computer system described in FIG. 11. However, it will be understood that method 800 may be performed, for example, by any suitable system, environment, software, and hardware, or a combination of systems, environments, software, and hardware, as appropriate. In some implementations, various steps of method 800 can be run in parallel, in combination, in loops, or in any order.

At step 802, method 800 involves generating a grid representation of a reservoir model comprising a simulation well, the grid comprising a plurality of grid-blocks, where the simulation well is centered in grid-block (i) of the plurality of grid-blocks.

At step 804, method 800 involves simulating, using the grid representation, grid-block pressures for the plurality of grid-blocks over a plurality of time steps.

At step 806, method 800 involves calculating an equivalent radius ($r_o^*$) for a grid-block (i+1), where the grid-block (i+1) is adjacent the grid-block (i).

At step 808, method 800 involves calculating, based on the equivalent radius and a grid-block (i+1) pressure, a shut-in bottom-hole pressure (SBHP) for the simulation well.

In some implementations, method 800 involves comparing the calculated SBHP to actual shut-in gauge pressures from a reservoir corresponding to the reservoir model. The SBHP calculated from simulated grid (i+1) pressures can be directly compared to the actual shut-in gauge pressures in order to calibrate the reservoir model (that is, perform history matching). Note that in low permeability reservoirs, where the gauge pressure reading is still building up when the pressure survey was ended, it is necessary to correct such transient final gauge pressures into equivalent average reservoir pressures before it is compared to simulated average reservoir pressure from commercially available simulators. This is a lot of work in a typical history-matching project where each well has several pressure data points over time and the history-matching project involves several hundreds of wells. On the other hand, method 800 ensures the output of simulation results are directly comparable to actual measured final gauge pressure regardless of whether or not the measured pressures are stabilized values.

In some implementations, method 800 involves providing the calibrated reservoir model to a drilling system in order to perform drilling operations (for example, drilling a wellbore) based on the calibrated reservoir model. The drilling system may include drilling tools such as a drill bit, a drill string, and a drill collar.

As mentioned previously, using the grid-block (i+1) pressure for calculating SBHP provides a more accurate calculation than using the grid-block (i) pressure. This finding is supported by empirical calculations. In an example, steps 802-808 are performed with a grid system with 200 ft×200 ft×5 ft grid-blocks. In this example, $r_o^*=100*(0.32*200) =164$ ft. Equation (8) is then rigorously solved using $r_o^*=164$ and using the grid-block (i+1) average pressures.

Figure 9:
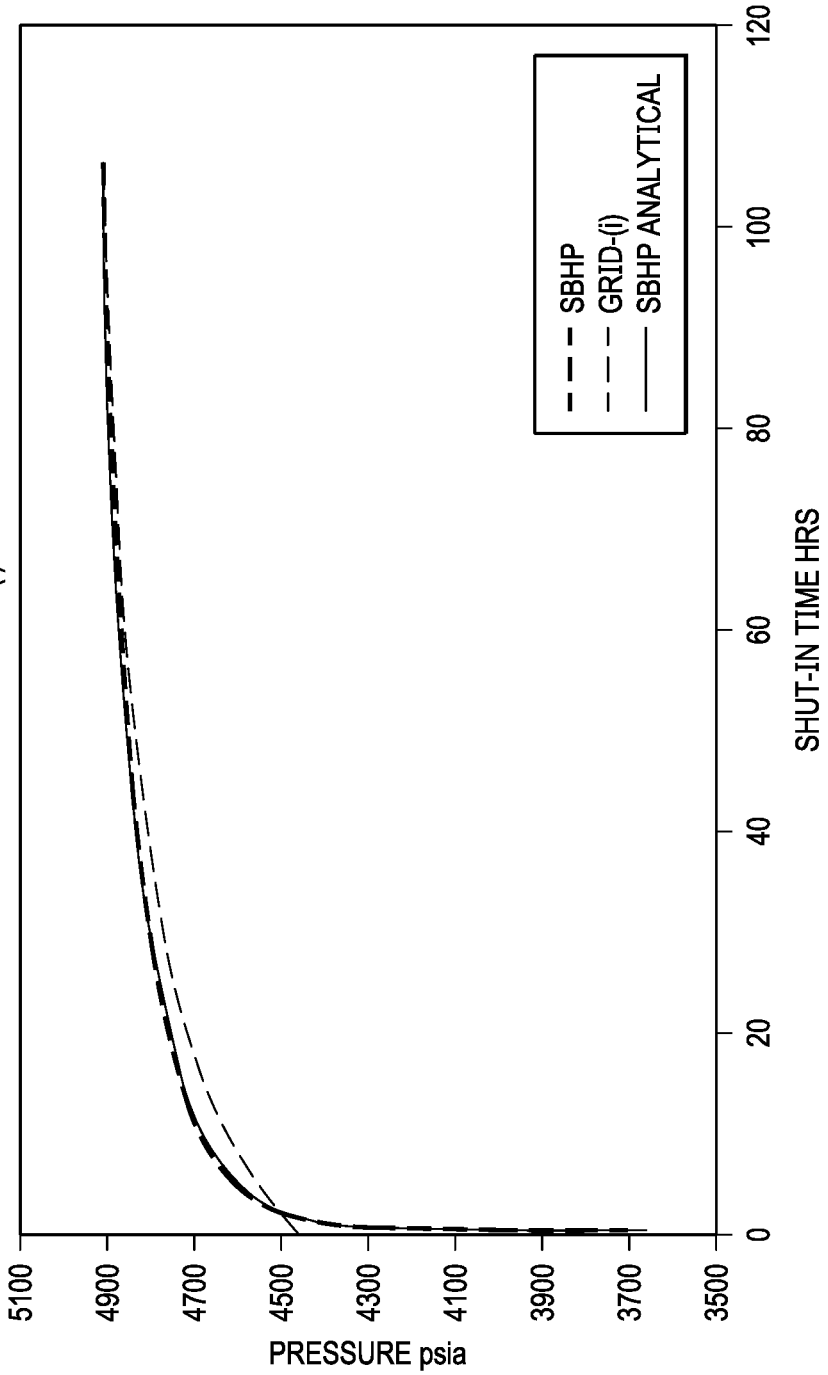
FIG. 9 illustrates a comparison of an average grid-block (i) pressure, an SBHP calculated, using a disclosed method, based on grid-block (i+1) average pressures, and an analytically calculated SBHP, according to some implementations of the present disclosure.

FIG. 9 illustrates a comparison of an average grid-block (i) pressure, an SBHP calculated based on grid-block (i+1) average pressures, and an analytically calculated SBHP, according to some implementations. As shown in FIG. 9, the calculated SBHP is consistent with the analytical solution but different from the simulated grid-block (i) pressure. Therefore, the grid-block (i) pressure is not directly applicable as a substitute for SBHP because grid-block (i) pressure is an average for the entire grid-block (i) block and not the actual wellbore values.

Figure 10:
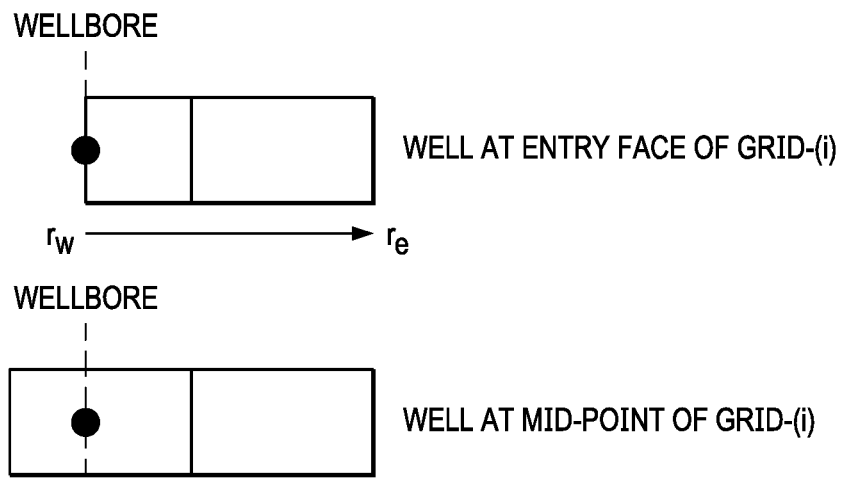
FIG. 10 illustrates a comparison of well location in analytical and numerical (simulation) solutions, according to some implementations of the present disclosure.

FIG. 10 illustrates a comparison of well location in analytical and numerical (simulation) solutions, according to some implementations. The analytical solution is based on the well located at entry of grid-block (i), whereas numerical simulation is based on the well located at the center of grid-block (i). In this arrangement, in a spatial discretization of 200 ft grid-size, there would be 100 ft of additional length over which pressure has been averaged in numerical simulation. For this reason, application of grid-block (i) average pressure does not give reliable results with the disclosed methods.

Figure 11:
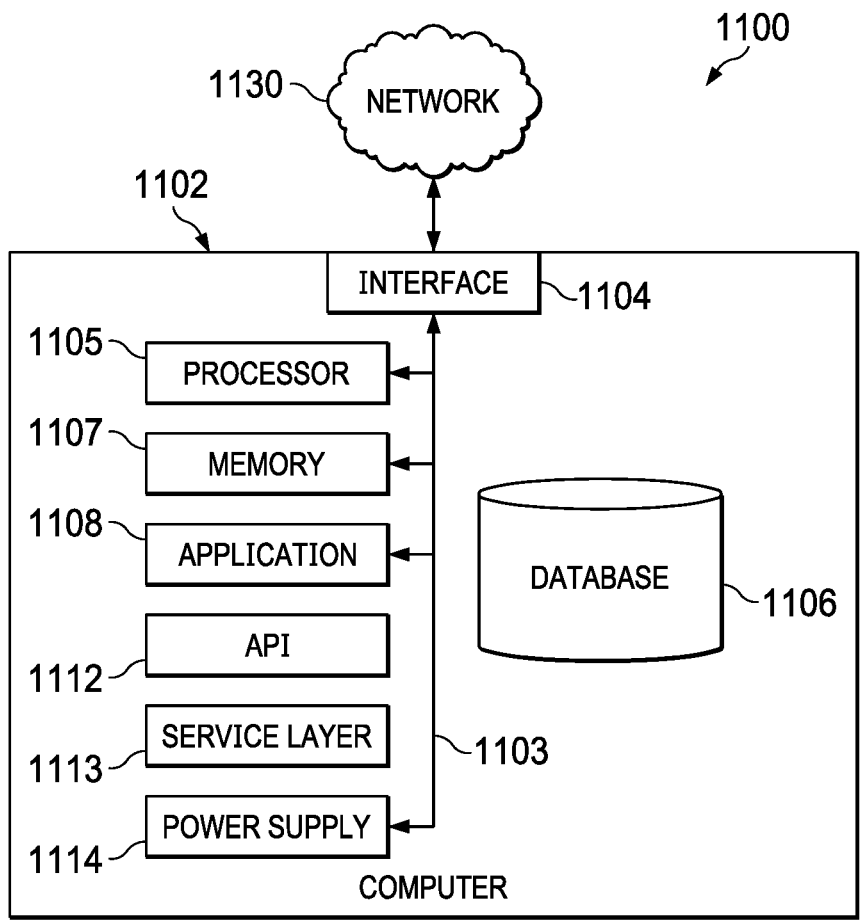
FIG. 11 is a block diagram of an example computer system used to provide computational functionalities associated with described algorithms, methods, functions, processes, flows, and procedures, according to some implementations of the present disclosure.

FIG. 11 is a block diagram of an example computer system 1100 used to provide computational functionalities associated with described algorithms, methods, functions, processes, flows, and procedures described in the present disclosure, according to some implementations of the present disclosure. The illustrated computer 1102 is intended to encompass any computing device such as a server, a desktop computer, a laptop/notebook computer, a wireless data port, a smart phone, a personal data assistant (PDA), a tablet computing device, or one or more processors within these devices, including physical instances, virtual instances, or both. The computer 1102 can include input devices such as keypads, keyboards, and touch screens that can accept user information. Also, the computer 1102 can include output devices that can convey information associated with the operation of the computer 1102. The information can include digital data, visual data, audio information, or a combination of information. The information can be presented in a graphical user interface (UI) (or GUI).

The computer 1102 can serve in a role as a client, a network component, a server, a database, a persistency, or components of a computer system for performing the subject matter described in the present disclosure. The illustrated computer 1102 is communicably coupled with a network 1130. In some implementations, one or more components of the computer 1102 can be configured to operate within different environments, including cloud-computing-based environments, local environments, global environments, and combinations of environments.

At a high level, the computer 1102 is an electronic computing device operable to receive, transmit, process, store, and manage data and information associated with the described subject matter. According to some implementations, the computer 1102 can also include, or be communicably coupled with, an application server, an email server, a web server, a caching server, a streaming data server, or a combination of servers.

The computer 1102 can receive requests over network 1130 from a client application (for example, executing on another computer 1102). The computer 1102 can respond to the received requests by processing the received requests using software applications. Requests can also be sent to the computer 1102 from internal users (for example, from a command console), external (or third) parties, automated applications, entities, individuals, systems, and computers.

Each of the components of the computer 1102 can communicate using a system bus 1103. In some implementations, any or all of the components of the computer 1102, including hardware or software components, can interface with each other or the interface 1104 (or a combination of both), over the system bus 1103. Interfaces can use an application programming interface (API) 1112, a service layer 1113, or a combination of the API 1112 and service layer 1113. The API 1112 can include specifications for routines, data structures, and object classes. The API 1112 can be either computer-language independent or dependent. The API 1112 can refer to a complete interface, a single function, or a set of APIs.

The service layer 1113 can provide software services to the computer 1102 and other components (whether illustrated or not) that are communicably coupled to the computer 1102. The functionality of the computer 1102 can be accessible for all service consumers using this service layer. Software services, such as those provided by the service layer 1113, can provide reusable, defined functionalities through a defined interface. For example, the interface can be software written in JAVA, C++, or a language providing data in extensible markup language (XML) format. While illustrated as an integrated component of the computer 1102, in alternative implementations, the API 1112 or the service layer 1113 can be stand-alone components in relation to other components of the computer 1102 and other components communicably coupled to the computer 1102. Moreover, any or all parts of the API 1112 or the service layer 1113 can be implemented as child or sub-modules of another software module, enterprise application, or hardware module without departing from the scope of the present disclosure.

The computer 1102 includes an interface 1104. Although illustrated as a single interface 1104 in FIG. 11, two or more interfaces 1104 can be used according to particular needs, desires, or particular implementations of the computer 1102 and the described functionality. The interface 1104 can be used by the computer 1102 for communicating with other systems that are connected to the network 1130 (whether illustrated or not) in a distributed environment. Generally, the interface 1104 can include, or be implemented using, logic encoded in software or hardware (or a combination of software and hardware) operable to communicate with the network 1130. More specifically, the interface 1104 can include software supporting one or more communication protocols associated with communications. As such, the network 1130 or the interface's hardware can be operable to communicate physical signals within and outside of the illustrated computer 1102.

The computer 1102 includes a processor 1105. Although illustrated as a single processor 1105 in FIG. 11, two or more processors 1105 can be used according to particular needs, desires, or particular implementations of the computer 1102 and the described functionality. Generally, the processor 1105 can execute instructions and can manipulate data to perform the operations of the computer 1102, including operations using algorithms, methods, functions, processes, flows, and procedures as described in the present disclosure.

The computer 1102 also includes a database 1106 that can hold data for the computer 1102 and other components connected to the network 1130 (whether illustrated or not). For example, database 1106 can be an in-memory, conventional, or a database storing data consistent with the present disclosure. In some implementations, database 1106 can be a combination of two or more different database types (for example, hybrid in-memory and conventional databases) according to particular needs, desires, or particular implementations of the computer 1102 and the described functionality. Although illustrated as a single database 1106 in FIG. 11, two or more databases (of the same, different, or combination of types) can be used according to particular needs, desires, or particular implementations of the computer 1102 and the described functionality. While database 1106 is illustrated as an internal component of the computer 1102, in alternative implementations, database 1106 can be external to the computer 1102.

The computer 1102 also includes a memory 1107 that can hold data for the computer 1102 or a combination of components connected to the network 1130 (whether illustrated or not). Memory 1107 can store any data consistent with the present disclosure. In some implementations, memory 1107 can be a combination of two or more different types of memory (for example, a combination of semiconductor and magnetic storage) according to particular needs, desires, or particular implementations of the computer 1102 and the described functionality. Although illustrated as a single memory 1107 in FIG. 11, two or more memories 1107 (of the same, different, or combination of types) can be used according to particular needs, desires, or particular implementations of the computer 1102 and the described functionality. While memory 1107 is illustrated as an internal component of the computer 1102, in alternative implementations, memory 1107 can be external to the computer 1102.

The application 1108 can be an algorithmic software engine providing functionality according to particular needs, desires, or particular implementations of the computer 1102 and the described functionality. For example, application 1108 can serve as one or more components, modules, or applications. Further, although illustrated as a single application 1108, the application 1108 can be implemented as multiple applications 1108 on the computer 1102. In addition, although illustrated as internal to the computer 1102, in alternative implementations, the application 1108 can be external to the computer 1102.

The computer 1102 can also include a power supply 1114. The power supply 1114 can include a rechargeable or non-rechargeable battery that can be configured to be either user- or non-user-replaceable. In some implementations, the power supply 1114 can include power-conversion and management circuits, including recharging, standby, and power management functionalities. In some implementations, the power-supply 1114 can include a power plug to allow the computer 1102 to be plugged into a wall socket or a power source to, for example, power the computer 1102 or recharge a rechargeable battery.

There can be any number of computers 1102 associated with, or external to, a computer system containing computer 1102, with each computer 1102 communicating over network 1130. Further, the terms "client," "user," and other appropriate terminology can be used interchangeably, as appropriate, without departing from the scope of the present disclosure. Moreover, the present disclosure contemplates that many users can use one computer 1102 and one user can use multiple computers 1102.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs. Each computer program can include one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal. For example, the signal can be a machine-generated electrical, optical, or electromagnetic signal that is generated to encode information for transmission to suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," and "electronic computer device" (or equivalent as understood by one of ordinary skill in the art) refer to data processing hardware. For example, a data processing apparatus can encompass all kinds of apparatuses, devices, and machines for processing data, including by way of example, a programmable processor, a computer, or multiple processors or computers. The apparatus can also include special purpose logic circuitry including, for example, a central processing unit (CPU), a field programmable gate array (FPGA), or an application specific integrated circuit (ASIC). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, for example LINUX, UNIX, WINDOWS, MAC OS, ANDROID, or IOS.

A computer program, which can also be referred to or described as a program, software, a software application, a module, a software module, a script, or code, can be written in any form of programming language. Programming languages can include, for example, compiled languages, interpreted languages, declarative languages, or procedural languages. Programs can be deployed in any form, including as stand-alone programs, modules, components, subroutines, or units for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files storing one or more modules, sub-programs, or portions of code. A computer program can be deployed for execution on one computer or on multiple computers that are located, for example, at one site or distributed across multiple sites that are interconnected by a communication network. While portions of the programs illustrated in the various figures may be shown as individual modules that implement the various features and functionality through various objects, methods, or processes, the programs can instead include a number of sub-modules, third-party services, components, and libraries. Conversely, the features and functionality of various components can be combined into single components as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and the apparatus can also be implemented as, special purpose logic circuitry, for example, a CPU, an FPGA, or an ASIC.

Computers suitable for the execution of a computer program can be based on one or more of general and special purpose microprocessors and other kinds of CPUs. The elements of a computer are a CPU for performing or executing instructions and one or more memory devices for storing instructions and data. Generally, a CPU can receive instructions and data from (and write data to) a memory. A computer can also include, or be operatively coupled to, one or more mass storage devices for storing data. In some implementations, a computer can receive data from, and transfer data to, the mass storage devices including, for example, magnetic, magneto optical disks, or optical disks. Moreover, a computer can be embedded in another device, for example, a mobile telephone, a personal digital assistant (PDA), a mobile audio or video player, a game console, a global positioning system (GPS) receiver, or a portable storage device such as a universal serial bus (USB) flash drive.

Computer readable media (transitory or non-transitory, as appropriate) suitable for storing computer program instructions and data can include all forms of permanent/non-permanent and volatile/non-volatile memory, media, and memory devices. Computer readable media can include, for example, semiconductor memory devices such as random access memory (RAM), read-only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Computer readable media can also include, for example, magnetic devices such as tape, cartridges, cassettes, and internal/removable disks. Computer readable media can also include magneto optical disks and optical memory devices and technologies including, for example, digital video disc (DVD), CD ROM, DVD+/−R, DVD-RAM, DVD-ROM, HD-DVD, and BLU-RAY. The memory can store various objects or data, including caches, classes, frameworks, applications, modules, backup data, jobs, web pages, web page templates, data structures, database tables, repositories, and dynamic information. Types of objects and data stored in memory can include parameters, variables, algorithms, instructions, rules, constraints, and references. Additionally, the memory can include logs, policies, security or access data, and reporting files. The processor and the memory can be supplemented by, or incorporated in, special purpose logic circuitry.

Implementations of the subject matter described in the present disclosure can be implemented on a computer having a display device for providing interaction with a user, including displaying information to (and receiving input from) the user. Types of display devices can include, for example, a cathode ray tube (CRT), a liquid crystal display (LCD), a light-emitting diode (LED), and a plasma monitor. Display devices can include a keyboard and pointing devices including, for example, a mouse, a trackball, or a trackpad. User input can also be provided to the computer through the use of a touchscreen, such as a tablet computer surface with pressure sensitivity or a multi-touch screen using capacitive or electric sensing. Other kinds of devices can be used to provide for interaction with a user, including to receive user feedback including, for example, sensory feedback including visual feedback, auditory feedback, or tactile feedback. Input from the user can be received in the form of acoustic, speech, or tactile input. In addition, a computer can interact with a user by sending documents to, and receiving documents from, a device that is used by the user. For example, the computer can send web pages to a web browser on a user's client device in response to requests received from the web browser.

The term "graphical user interface," or "GUI," can be used in the singular or the plural to describe one or more graphical user interfaces and each of the displays of a particular graphical user interface. Therefore, a GUI can represent any graphical user interface, including, but not limited to, a web browser, a touch screen, or a command line interface (CLI) that processes information and efficiently presents the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back end component, for example, as a data server, or that includes a middleware component, for example, an application server. Moreover, the computing system can include a front-end component, for example, a client computer having one or both of a graphical user interface or a Web browser through which a user can interact with the computer. The components of the system can be interconnected by any form or medium of wireline or wireless digital data communication (or a combination of data communication) in a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) (for example, using 802.11 a/b/g/n or 802.20 or a combination of protocols), all or a portion of the Internet, or any other communication system or systems at one or more locations (or a combination of communication networks). The network can communicate with, for example, Internet Protocol (IP) packets, frame relay frames, asynchronous transfer mode (ATM) cells, voice, video, data, or a combination of communication types between network addresses.

The computing system can include clients and servers. A client and server can generally be remote from each other and can typically interact through a communication network. The relationship of client and server can arise by virtue of computer programs running on the respective computers and having a client-server relationship.

Cluster file systems can be any file system type accessible from multiple servers for read and update. Locking or consistency tracking may not be necessary since the locking of exchange file system can be done at application layer. Furthermore, Unicode data files can be different from non-Unicode data files.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations, and it should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system comprising a computer memory interoperably coupled with a hardware processor configured to perform the computer-implemented method or the instructions stored on the non-transitory, computer-readable medium.

I claim:

1. A method comprising:
    generating a grid representation of a reservoir model comprising a simulation well, the grid comprising a plurality of grid-blocks, wherein the simulation well is centered in a first grid-block of the plurality of grid-blocks;
    simulating, using the grid representation, grid-block pressures for the plurality of grid-blocks over a plurality of time steps;
    calculating an equivalent radius ($r_o^*$) for a second grid-block adjacent to the first grid-block; and
    calculating, based on the equivalent radius and a pressure of the second grid-block, a shut-in bottom-hole pressure (SBHP) for the simulation well.

2. The method of claim 1, wherein the equivalent radius for the second grid-block is a distance from the simulation well at which actual pressure is equal to an average pressure of the second grid-block, and wherein the equivalent radius is calculated according to the equation:

$$r_o^* = 0.5\Delta x + r_o,$$

wherein $\Delta x$ is a width of each of the plurality of grid-blocks and $r_o$ is a conventional equivalent radius for the second grid-block.

3. The method of claim 2, wherein the conventional equivalent radius is a radius at which the second grid-block pressure is equal to a pressure from an analytical solution for steady-state single-phase flow in the second grid-block, and wherein the conventional equivalent radius is calculated according to the equation:

$$r_o = 0.32\Delta x.$$

4. The method of claim 1, wherein calculating, based on the equivalent radius and the second grid-block pressure, the SBHP for the simulation well comprises:
    calculating the SBHP using the equation:

$$P_{(r_w, \Delta t)} = P_{(r_o^*, \Delta t)} - \left[\theta\left(-Ei\left(\frac{-\alpha r_o^{*2}}{\Delta t}\right)\right) - \theta\left(-Ei\left(\frac{-\alpha r_o^{*2}}{(t_p + \Delta t)}\right)\right) - \theta\left(-Ei\left(\frac{-\alpha r_w^2}{\Delta t}\right)\right) + \theta\left(-Ei\left(\frac{-\alpha r_w^2}{(t_p + \Delta t)}\right)\right)\right],$$

wherein:
    $-Ei(x) = -\ln(1.78 * x)$,
    $r_w$ is a wellbore radius,
    $t_p$ is a shut-in time, $$\theta = 70.6 \frac{q\beta\mu}{\kappa h},$$

$$\alpha = \left(\frac{-948\phi\mu c_t}{\kappa}\right),$$

q is an oil flow rate,
β is a formation volume factor,
μ is a viscosity of oil at reservoir conditions,
k is reservoir permeability,
h is reservoir thickness,
φ is reservoir porosity fraction, and
$c_t$ is total compressibility.

5. The method of claim 1, wherein the SBHP is validated by an analytically derived SBHP, the analytically derived SBHP calculated using the equation:

$$P_i - P_{(r_w,\Delta t)} = 70.6\frac{q\beta\mu}{\kappa h}\text{Ln}\left(\frac{t_p + \Delta t}{\Delta t}\right).$$

6. The method of claim 1, further comprising:
comparing the SBHP to actual shut-in gauge pressures from a reservoir corresponding to the reservoir model; and
based on the comparison, calibrating the reservoir model.

7. A device comprising:
one or more processors; and
a non-transitory computer-readable storage medium coupled to the one or more processors and storing programming instructions for execution by the one or more processors, the programming instructions instructing the one or more processors to perform operations comprising:
generating a grid representation of a reservoir model comprising a simulation well, the grid comprising a plurality of grid-blocks, wherein the simulation well is centered in a first grid-block of the plurality of grid-blocks;
simulating, using the grid representation, grid-block pressures for the plurality of grid-blocks over a plurality of time steps;
calculating an equivalent radius ($r_o$*) for a second grid-block adjacent to the first grid-block; and
calculating, based on the equivalent radius and a pressure of the second grid-block, a shut-in bottom-hole pressure (SBHP) for the simulation well.

8. The device of claim 7, wherein the equivalent radius for the second grid-block is a distance from the simulation well at which actual pressure is equal to an average pressure of the second grid-block, and wherein the equivalent radius is calculated according to the equation:

$r_o*=0.5\Delta x+r_o,$ wherein $\Delta x$ is a width of each of the plurality of grid-blocks and $r_o$ is a conventional equivalent radius for the second grid-block.

9. The device of claim 8, wherein the conventional equivalent radius is a radius at which the second grid-block pressure is equal to a pressure from an analytical solution for steady-state single-phase flow in the second grid-block, and wherein the conventional equivalent radius is calculated according to the equation:

$r_o=0.32\Delta x.$

10. The device of claim 7, wherein calculating, based on the equivalent radius and the second grid-block pressure, the SBHP for the simulation well comprises:
calculating the SBHP using the equation:

$$P_{(r_w,\Delta t)} = P_{(r_o^*,\Delta t)} - \left[\theta\left(-Ei\left(\frac{-\alpha r_o^{*2}}{\Delta t}\right)\right) - \right.$$
$$\left.\theta\left(-Ei\left(\frac{-\alpha r_o^{*2}}{(t_p+\Delta t)}\right)\right) - \theta\left(-Ei\left(\frac{-\alpha r_w^2}{\Delta t}\right)\right) + \theta\left(-Ei\left(\frac{-\alpha r_w^2}{(t_p+\Delta t)}\right)\right)\right],$$

wherein:
$-Ei(x)=-\ln(1.78*x),$
$r_w$ is a wellbore radius,
$t_p$ is a shut-in time, $\theta = 70.6\frac{q\beta\mu}{\kappa h},$ $\alpha = \left(\frac{-948\phi\mu c_t}{\kappa}\right),$ q is an oil flow rate,
β is a formation volume factor,
μ is a viscosity of oil at reservoir conditions,
k is reservoir permeability,
h is reservoir thickness,
ϕ is reservoir porosity fraction, and
$c_t$ is total compressibility.

11. The device of claim 7, wherein the SBHP is validated by an analytically derived SBHP, the analytically derived SBHP calculated using the equation:

$$P_i - P_{(r_w,\Delta t)} = 70.6\frac{q\beta\mu}{\kappa h}\text{Ln}\left(\frac{t_p + \Delta t}{\Delta t}\right).$$

12. The device of claim 7, wherein the operations further comprise:
comparing the SBHP to actual shut-in gauge pressures from a reservoir corresponding to the reservoir model; and
based on the comparison, calibrating the reservoir model.

13. A non-transitory computer-readable medium storing instructions executable by a computer system to perform operations comprising:
generating a grid representation of a reservoir model comprising a simulation well, the grid comprising a plurality of grid-blocks, wherein the simulation well is centered in a first grid-block of the plurality of grid-blocks;
simulating, using the grid representation, grid-block pressures for the plurality of grid-blocks over a plurality of time steps;
calculating an equivalent radius ($r_o$*) for a second grid-block adjacent to the first grid-block; and
calculating, based on the equivalent radius and a pressure of the second grid-block, a shut-in bottom-hole pressure (SBHP) for the simulation well.

14. The non-transitory computer-readable medium of claim 13, wherein the equivalent radius for the second grid-block is a distance from the simulation well at which actual pressure is equal to an average pressure of the second grid-block, and wherein the equivalent radius is calculated according to the equation:

$r_o*=0.5\Delta x+r_o,$ wherein $\Delta x$ is a width of each of the plurality of grid-blocks and $r_o$ is a conventional equivalent radius for the second grid-block.

15. The non-transitory computer-readable medium of claim 14, wherein the conventional equivalent radius is a radius at which the second grid-block pressure is equal to a pressure from an analytical solution for steady-state single-phase flow in the second grid-block, and wherein the conventional equivalent radius is calculated according to the equation:

$r_o=0.32\Delta x.$

16. The non-transitory computer-readable medium of claim 13, calculating, based on the equivalent radius and the second grid-block pressure, the SBHP for the simulation well comprises:

calculating the SBHP using the equation:

$$P_{(r_w,\Delta t)} = P_{(r_o^*,\Delta t)} - \left[\theta\left(-Ei\left(\frac{-\alpha r_o^{*2}}{\Delta t}\right)\right) - \theta\left(-Ei\left(\frac{-\alpha r_o^{*2}}{(t_p+\Delta t)}\right)\right) - \theta\left(-Ei\left(\frac{-\alpha r_w^2}{\Delta t}\right)\right) + \theta\left(-Ei\left(\frac{-\alpha r_w^2}{(t_p+\Delta t)}\right)\right)\right],$$

wherein:
- $-Ei(x) = -\ln(1.78*x)$,
- $r_w$ is a wellbore radius,
- $t_p$ is a shut-in time, $$\theta = 70.6\frac{q\beta\mu}{\kappa h},$$

$$\alpha = \left(\frac{-948\phi\mu c_t}{\kappa}\right),$$

- q is an oil flow rate,
- β is a formation volume factor,
- μ is a viscosity of oil at reservoir conditions,
- k is reservoir permeability,
- h is reservoir thickness,
- φ is reservoir porosity fraction, and
- $c_t$ is total compressibility.

17. The non-transitory computer-readable medium of claim 13, wherein the SBHP is validated by an analytically derived SBHP, the analytically derived SBHP calculated using the equation:

$$P_i - P_{(r_w,\Delta t)} = 70.6\frac{q\beta\mu}{\kappa h}\text{Ln}\left(\frac{t_p+\Delta t}{\Delta t}\right).$$

* * * * *